US012750051B2

(12) United States Patent
Kaufmann et al.

(10) Patent No.: US 12,750,051 B2
(45) Date of Patent: Sep. 29, 2026

(54) BOOTSTRAP CIRCUIT

(71) Applicant: Texas Instruments Incorporated, Dallas, TX (US)

(72) Inventors: Maik Peter Kaufmann, Freising (DE); Stefan Herzer, Marzling (DE); Michael Lueders, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/443,902

(22) Filed: Feb. 16, 2024

(65) Prior Publication Data

US 2025/0266825 A1 Aug. 21, 2025

(51) Int. Cl.
*H03K 17/56* (2006.01)

(52) U.S. Cl.
CPC ..... *H03K 17/56* (2013.01); *H03K 2217/0063* (2013.01); *H03K 2217/0072* (2013.01)

(58) Field of Classification Search
CPC ........... H03K 17/56; H03K 2217/0063; H03K 2217/0072
See application file for complete search history.

(56) References Cited

U.S. PATENT DOCUMENTS 6,646,508 B1 11/2003 Barbetta
7,253,589 B1 * 8/2007 Potanin ............... H02J 7/00302 320/144
9,331,689 B2 5/2016 Koyama
9,571,093 B2 2/2017 Kinzer
9,929,652 B1 3/2018 Ribarich
9,960,620 B2 5/2018 Kinzer
10,333,327 B2 6/2019 Kinzer
10,601,302 B1 3/2020 Sharma
10,673,426 B2 6/2020 Ming
10,756,725 B2 8/2020 Jordanger
10,778,219 B2 * 9/2020 Sharma .................. H03K 3/037
10,804,894 B1 10/2020 Todaka
10,811,951 B1 10/2020 Sharma
10,897,142 B2 1/2021 Kinzer
10,911,045 B1 2/2021 Ming
2005/0168206 A1 8/2005 Nadd
2007/0182390 A1 * 8/2007 Ishii ..................... H03K 17/165 323/282
2008/0018364 A1 1/2008 Clarkin
2008/0100378 A1 * 5/2008 Bernacchia ......... H02M 7/5388 327/589
2017/0070220 A1 3/2017 Yoshida
2020/0153338 A1 * 5/2020 Ribarich ................ H03K 17/06
2020/0243518 A1 * 7/2020 Patti ..................... H10D 30/015
2021/0143647 A1 5/2021 Kinzer
2022/0321116 A1 10/2022 Niikura

* cited by examiner

*Primary Examiner* — Sibin Chen
(74) *Attorney, Agent, or Firm* — Zhenhai Fu; Frank D. Cimino

(57) ABSTRACT

In one example, an apparatus comprises: a first transistor having a first control terminal and first and second current terminals; a capacitor coupled between a switching terminal and the first current terminal; a second transistor having a second control terminal and coupled between the switching terminal and a ground terminal; and a sensing and control circuit having a power terminal, a third current terminal, an enable input and a transistor control output, the third current terminal coupled to the second current terminal, the enable input coupled to the second control terminal, and the transistor control output coupled to the first control terminal.

20 Claims, 9 Drawing Sheets

BOOTSTRAP CIRCUIT

BACKGROUND

A half-bridge circuit includes a high side switch coupled between a power input and a switching terminal, and a low side switch coupled between the switching terminal and a ground terminal. Each of the high side and low side switches can include a respective transistor. The power input can receive an input voltage, and the ground terminal can be at a ground voltage. When the high side transistor is turned on and the low side transistor is turned off, the switching terminal can be at or close to the input voltage. Also, when the high side transistor is turned off and the low side transistor is turned on, the switching terminal can be at or close to the ground voltage. According, the switching terminal voltage switches between the input voltage and the ground voltage.

A half-bridge circuit can be driven by a pair of driver circuits, one for driving the gate of the low side transistor and one for driving the gate of the high side transistor. When the low side transistor is disabled and the switching terminal voltage rises, the driver circuit of the high side transistor may increase the driving voltage to exceed the switching terminal voltage by a margin, so that gate-source voltage of the high side transistor can exceed a threshold voltage to turn on the high side transistor. In some examples, a bootstrap circuit including a capacitor can provide a supply voltage that tracks and is elevated from the switching terminal voltage to the high side driver circuit. This allows the high side driver circuit to provide the increased driving voltage to turn on the high side transistor. Charging of the bootstrap capacitor may present various issues that can affect safety and reliability as well as the performance of the driver circuits.

SUMMARY

In one example, an apparatus comprises: a first transistor having a first control terminal and first and second current terminals; a capacitor coupled between a switching terminal and the first current terminal; a second transistor having a second control terminal and coupled between the switching terminal and a ground terminal; and a sensing and control circuit having a power terminal, a third current terminal, an enable input and a transistor control output, the third current terminal coupled to the second current terminal, the enable input coupled to the second control terminal, and the transistor control output coupled to the first control terminal.

In one example, a system comprises: a first transistor coupled between a power input and a switching terminal, the first transistor having a first transistor control input; a second transistor coupled between the switching terminal and a ground terminal, the second transistor having a second transistor control input; a first driver having a first driver output, a first power supply terminal, and a first reference terminal, the first driver output coupled to the first transistor control input, and the first reference terminal coupled to the switching terminal; a capacitor coupled between the first power supply terminal and the first reference terminal; a second driver having a second driver output, a second power supply terminal, and a second reference terminal, the second driver output coupled to the second transistor control input, and the second reference terminal coupled to the ground terminal; a sensing and control circuit having a power terminal, a current terminal, an enable input and a transistor control output, the power terminal coupled to the second power supply terminal, and the enable input coupled to the second transistor control input; and a third transistor coupled between the current terminal and the first power supply terminal, the third transistor having a third transistor control input coupled to the transistor control output.

In one example, a method comprises: receiving a low side (LS) switch enable signal; responsive to the LS switch enable signal having a first state, setting a voltage on a control terminal of a transistor based on sensing a current from a power source through the transistor to a capacitor coupled between the transistor and a low side switch; and responsive to the LS switch enable signal having a second state, disabling the transistor to disconnect the capacitor from the power source.

DETAILED DESCRIPTION

In this description, the same reference numbers depict same or similar (by function and/or structure) features. The drawings are not necessarily drawn to scale.

Figure 1:
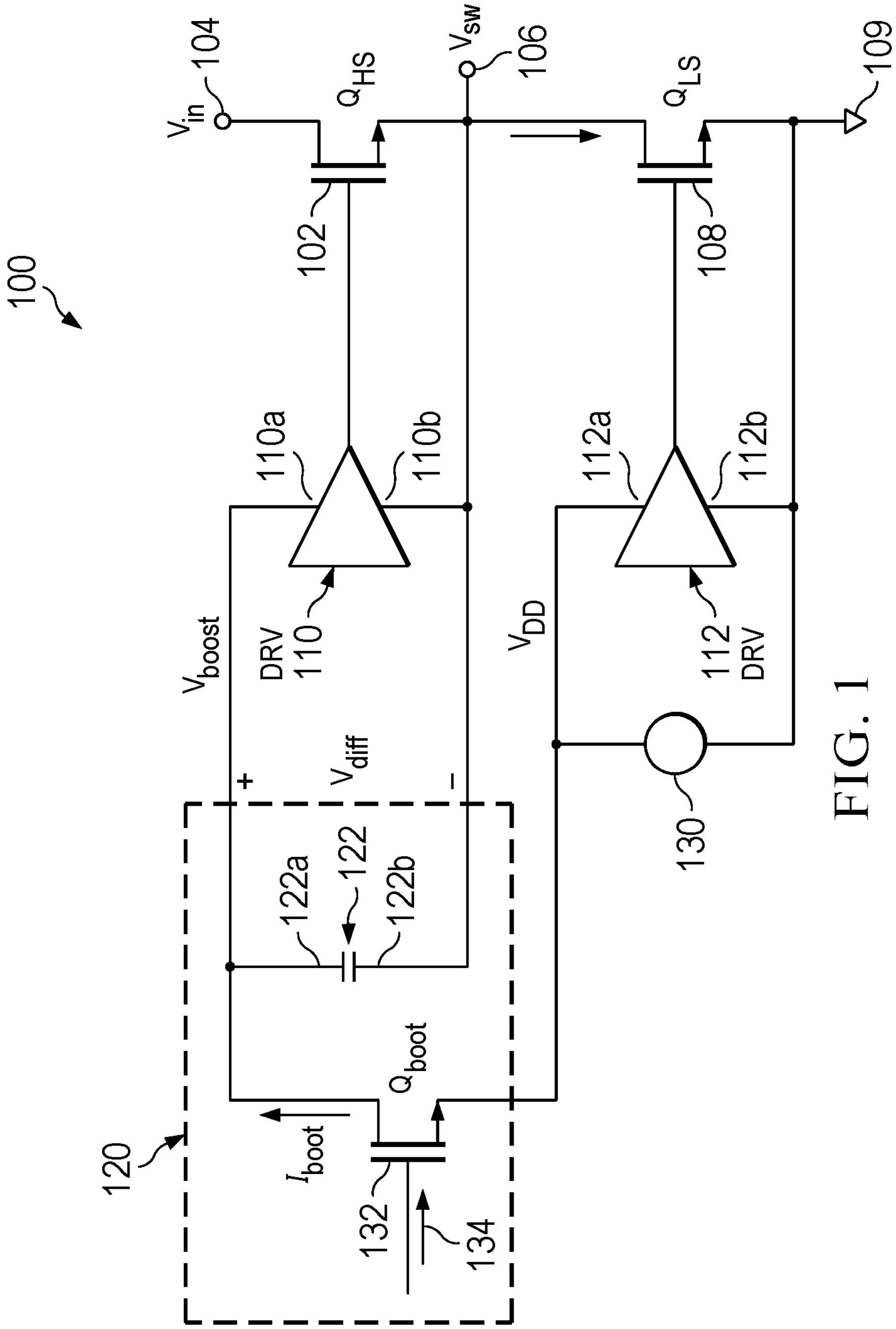
FIG. 1 is a schematic illustrating an example half bridge circuit including an example bootstrap circuit.

FIG. 1 shows an example half-bridge circuit 100. Half-bridge circuit 100 includes a high side (HS) switch 102 (also labelled $Q_{HS}$) coupled between a power input 104 and a switching terminal 106, and a low side (LS) switch 108 (also labelled $Q_{LS}$) coupled between switching terminal 106 and a ground terminal 109. Each of the high side and low side switches can include a respective transistor, such as a field effect transistor (FET), an enhancement mode (E-mode) high electron mobility transistor (HEMT), etc. Power input can receive an input voltage (Vin in FIG. 1), and the ground terminal can be at a ground voltage, which can be zero. In some examples, half-bridge circuit 100 can be configured for high voltage application, and the input voltage can be at several hundred volts (e.g., 400 V or higher). Half-bridge circuit 100 can be part of a switch mode power converter, a motor inverter, etc. In a case where half-bridge circuit 100 is a switch mode power converter, low side switch 108 can operate as synchronous rectifier.

High side transistor 102 and low side transistor 108 are turned on at different times. When high side transistor 102 is turned on and low side transistor 108 is turned off, the voltage at switching terminal 106 ($V_{sw}$ in FIG. 1) can be at or close to the input voltage Vin. Also, when high side transistor 102 is turned off and low side transistor 108 is turned on, the switching terminal voltage $V_{sw}$ can be at or close to the ground voltage. According, the switching terminal voltage $V_{sw}$ can switch between the input voltage and the ground voltage.

Half-bridge circuit 100 can be driven by a pair of driver circuits, including driver circuit 110 that drives the gate of high side transistor 102 and driver circuit 112 that drives the gate of low side transistor 108. In some examples, driver circuits 110 and 112 can have the same type of transistor devices (e.g., FET, E-mode HEMT, etc.) as low side and high side transistors 102 and 108 and can be integrated on a same semiconductor die. In some examples, driver circuits 110 and 112 can have different types of transistor devices from low side and high side transistors 102 and 108. When low side transistor 108 is disabled and the switching terminal voltage $V_{sw}$ increases, driver circuit 110 may increase the driving voltage to exceed the switching terminal voltage by a margin, so that gate-source voltage of high side transistor 102 can exceed a threshold voltage (Vt) to turn on high side transistor 102. To provide the increased driving voltage, a bootstrap circuit 120 including a capacitor 122 can be provided. Capacitor 122 has a first terminal 122*a* coupled to a voltage supply terminal 110*a* and a second terminal 122*b* coupled to a reference terminal 110*b* of driver circuit 110. Reference terminal 110*b* of driver circuit 110 is also coupled to switching terminal 106.

Bootstrap circuit 120 can charge capacitor 122 to store a voltage difference $V_{diff}$ across the capacitor, and capacitor 122 can provide a supply voltage $V_{boost}$ at voltage supply terminal 110*a* as a sum of $V_{diff}$ and $V_{sw}$. In some examples, capacitor 122 can be an off-chip capacitor having a capacitance in the order of microFarad (uF) to provide sufficient current to driver circuit 110 to turn on/off high side transistor 102 while largely maintaining the voltage difference $V_{diff}$ across the capacitor. As the switching terminal voltage $V_{sw}$ increases when low side transistor 108 is disabled, the $V_{boost}$ voltage also increases and becomes a bootstrapped version of $V_{sw}$. This allows high side driver circuit 110 to provide the increased driving voltage to turn on high side transistor 102. On the other hand, driver circuit 112 does not need to provide an increased driving voltage to low side transistor 108 because the source of low side transistor 108 is coupled to ground terminal 109 and has a largely static voltage (e.g., at zero volts). Driver circuit 112 can have a voltage supply terminal 112*a* and a reference terminal 112*b*, with voltage supply terminal 112*a* coupled to an auxiliary power source 130 that provides a relatively low voltage (e.g., 10-20V, labeled $V_{DD}$ in FIG. 1) and reference terminal 112*b* coupled to ground terminal 109. As to be described below, power source 130 also provides a current to charge capacitor 122 and set the voltage across capacitor 122 $V_{diff}$ to be equal to $V_{DD}$.

Specifically, bootstrap circuit 120 includes a transistor 132 (also labelled $Q_{boot}$ in the figures) coupled between power source 130 and capacitor 122 to control the charging of capacitor 122 using a charging current (labelled $I_{boot}$ in the figures) from power source 130. Transistor 132 can be a rectifier to allow current/charge to flow from auxiliary power source 130 to capacitor 122, but not the opposite way. Transistor 132 can also be a synchronous rectifier that is turned on/off by a control signal 134 according to the state of the low side switch 108. Specifically, during a charging phase, low side transistor 108 is enabled to connect switching terminal 106 (and second terminal 122*b* of capacitor 122) to ground terminal 109 and set $V_{sw}$ to zero. During the charging phase, transistor 132 can be enabled to charge capacitor 122. If control signal 134 exceeds $V_{DD}$ (e.g., by at least a threshold voltage), power source 130 can also set the $V_{boost}$ voltage of first terminal 122*a* of capacitor 122 (and power terminal 110*a* of driver circuit 110*a*) to $V_{DD}$. Also, during a discharging/bootstrapping phase when low side transistor 108 is disabled, capacitor 122 provides the bootstrapped $V_{boost}$ supply voltage and current to driver circuit 110 to turn on high side transistor 102. During the discharging/bootstrapping phase, transistor 132 can be disabled to avoid charge from capacitor 122 flowing back to voltage source 130 as $V_{sw}$ (and $V_{boost}$) increases above $V_{DD}$.

Having a transistor instead of a passive device (e.g., a diode) as a rectifier can provide various advantages. Specifically, a diode will incur a voltage drop equal to its forward voltage to conduct a current. The forward voltage can be significant compared with $V_{DD}$ and is a fixed value. On the other hand, the voltage drop across a transistor can be reduced by, for example, increasing the width and/or gate overdrive voltage of the transistor. Accordingly, having a transistor instead of a diode to control the charging current can reduce the voltage drop between auxiliary power source 130 and first terminal 122*a* of capacitor 122. This allows the voltage at first terminal 122*a* of capacitor 122 to be close to $V_{DD}$, which in turn increases the bootstrapped $V_{boost}$ supply voltage.

Further, transistor 132 can have a much higher power density than a diode integrated on a semiconductor due. For example, transistor 132 can be a HEMT. A diode having a comparable power density may be implemented as an off-chip diode, but such an off-chip diode may require additional chip interconnects for connection to bootstrap circuit 120.

Implementing transistor 132 as a HEMT can offer additional advantages, such as a higher operating temperature, a lower on-resistance, etc., all of which allow transistor 132 to conduct a large charging current $I_{boot}$ and reduce the charging time. This is especially advantageous for charging a large off-chip capacitor 122 whose capacitance can be in the order of uF. The charging time can also fit a short low side on-time (e.g., 400 nanoseconds (ns) or less), which allows half-bridge circuit 100 to operate at a high frequency or a large duty cycle (e.g., >99%). Further, a diode introduces a voltage drop equal to a fixed forward voltage as the diode conducts, while the voltage drop across a transistor can be fined by its on-resistance and the current flow, and can be reduced by, for example, increasing the width and/or gate overdrive voltage of the transistor.

There are challenges associated with providing control signal 134 during different phases of operation due to various safety and operation requirements. Specifically, during the charging phase, if capacitor 122 is in an initial state with none or very little charge, there can be a large voltage difference across transistor 132. If the charging current $I_{boot}$ is not limited or otherwise controlled, combined with the large voltage difference, transistor 132 may dissipate a large amount of power, which may also lead to a prohibitively high temperature and destroy transistor 132, even if transistor 132 is a HEMT device that can tolerate a high temperature. Accordingly, the charging current can be limited to a low value during the initial stage of the charging phase. On the other hand, towards the end of the charging phase, the voltage difference across transistor 132 may be small, and transistor 132 may conduct a large amount of charging current $I_{boot}$, without leading to a high power and a high temperature at transistor 132, to speed up the charging. Further, as described above, for transistor 132 to bring the $V_{boost}$ voltage to close to $V_{DD}$ during the charging phase, control signal 134 can be set at a voltage that exceeds $V_{DD}$ by at least the threshold voltage of transistor 132. Setting control signal 134 at a fixed voltage level during the charging phase may be unable to satisfy all these requirements. Also, transistor 132 may need to be disabled both in the charging phase (e.g., to stop the charging when the voltage at first terminal 122*a* of capacitor 122 reaches $V_{DD}$) and in the discharging phase (when low side transistor 108 is disabled to prevent charge flowing back to auxiliary power source 130). One way of disabling transistor 132 is by electrically connecting the gate and source of transistor 132, with both the gate and source voltages of transistor 132 at $V_{DD}$. But even with such arrangements, transistor 132 may remain enabled when, for example, during the charging phase $V_{sw}$ is at zero and the $V_{boost}$ voltage at first terminal 122*a* of capacitor 122 is lower than $V_{DD}$.

Figure 2:
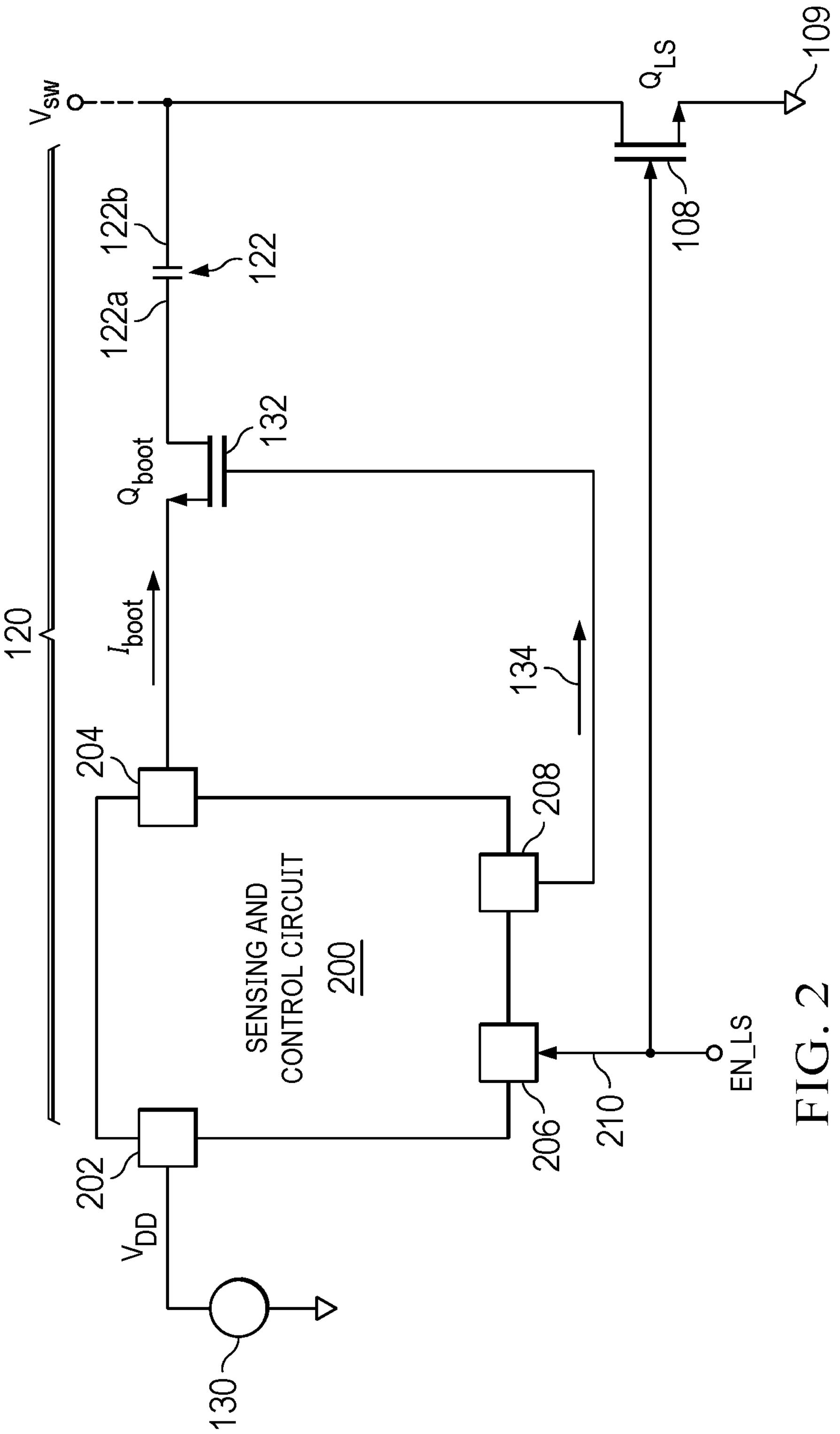
FIG. 2 is a schematic illustrating an example bootstrap circuit.

FIG. 2 is a schematic illustrating additional components of bootstrap circuit 120 that can address at least some of the issues described above. Referring to FIG. 2, bootstrap circuit 120 includes, in addition to capacitor 122 and transistor 124, a sensing and control circuit 200. Sensing and control circuit 200 has a power terminal 202, a current terminal 204, an enable input 206 and a transistor control output 208. Power terminal 202 is coupled to auxiliary power source 130, which supplies a $V_{DD}$ voltage. Current terminal 204 is coupled to transistor 132. Enable input 206 is coupled to the control terminal of low side switch/transistor 108 (also labelled EN_LS in the figures) to receive an enable signal 210.

Specifically, during the charging phase when low side switch 108 is enabled, sensing and control circuit 200 can receive the charging current $I_{boot}$ from auxiliary power source 130 through power terminal 202, and provide the charging current $I_{boot}$ through current terminal 204 to transistor 132 for charging capacitor 122. Sensing and control circuit 200 can also regulate the amount of charging current $I_{boot}$ at a target value. As to be described below, sensing and control circuit 200 can sense the amount of charging current $I_{boot}$ between power terminal 202 and current terminal 204, and adjust control signal 134 (and the gate voltage of transistor 132) to adjust the on-resistance of transistor 132, to regulate the amount of charging current $I_{boot}$ at the target value.

In some examples, the target value of the charging current $I_{boot}$ can be a constant throughout the charging phase. The target value can be chosen based on, for example, the capacitance of capacitor 122, the amount of LS on-time, the maximum power of transistor 132, etc., so that the charging of capacitor 122 can complete within the LS on-time. In some examples, the target value may change during the charging phase to maintain the power level of transistor 132. For example, during the initial stage of the charging phase where the voltage across capacitor 122 is much smaller than $V_{DD}$, the voltage across transistor 132 can be large, and the target value of $I_{boot}$ can be reduced. During a later stage of the charging phase where the voltage across capacitor 122 close to $V_{DD}$, the voltage across transistor 132 can become small, and the target value of $I_{boot}$ can be increased speed up the charging. By adapting the target value of $I_{boot}$ to the voltage across transistor 132, a relatively constant power level can be maintained at transistor 132 to improve safety, while charging speed can be improved as well.

Also, during the charging phase, as the voltage at second terminal 122*a* increases due to the charging of capacitor 122, sensing and control circuit 200 can also bootstrap control signal 134 (by adding a voltage offset) to ensure that the voltage of first terminal 122*a* can reach the $V_{DD}$ voltage provided by auxiliary power source 130. As to be described below, sensing and control circuit 200 can compare voltage signal 320 at output 306*c* of amplifier 306, which can reflect the gate voltage and the source voltage of transistor 132 (and the voltage at first terminal 122*a*), with a reference voltage, and bootstrap control signal 134 if voltage signal 320 exceeds the reference voltage. The reference voltage can be below $V_{DD}$, and bootstrapped control signal can 134 exceed $V_{DD}$ and track $I_{boot}$ as the charging continues and the voltage of first terminal 122*a* continues increasing. Accordingly, as the voltage of first terminal 122*a* approaches the $V_{DD}$ voltage, transistor 132 can continue to conduct $I_{boot}$ and charge capacitor 122, and sensing and control circuit 200 can continue regulating $I_{boot}$.

Further, during the discharging phase, sensing and control circuit 200 can set a state of control signal 134 to disable transistor 132. In some examples, sensing and control circuit 200 can set control signal 134 to a ground voltage to ensure that transistor 132 is disabled. In examples where transistor 132 is an E-mode HEMT, the gate structure of the E-mode HEMT has back-to-back diodes that can shield the transistor from a large gate-source/gate drain voltage stress, which allows setting control signal 134 to a ground voltage without affecting the reliability of transistor 132. Sensing and control circuit 200 can detect the charging phase and discharging phase based on the state of enable signal 210, and provide control signal 134 to either enable transistor 132 to charge capacitor 122 or disable transistor 132 to disconnect capacitor 122 from auxiliary power source 130 accordingly.

Figure 3:
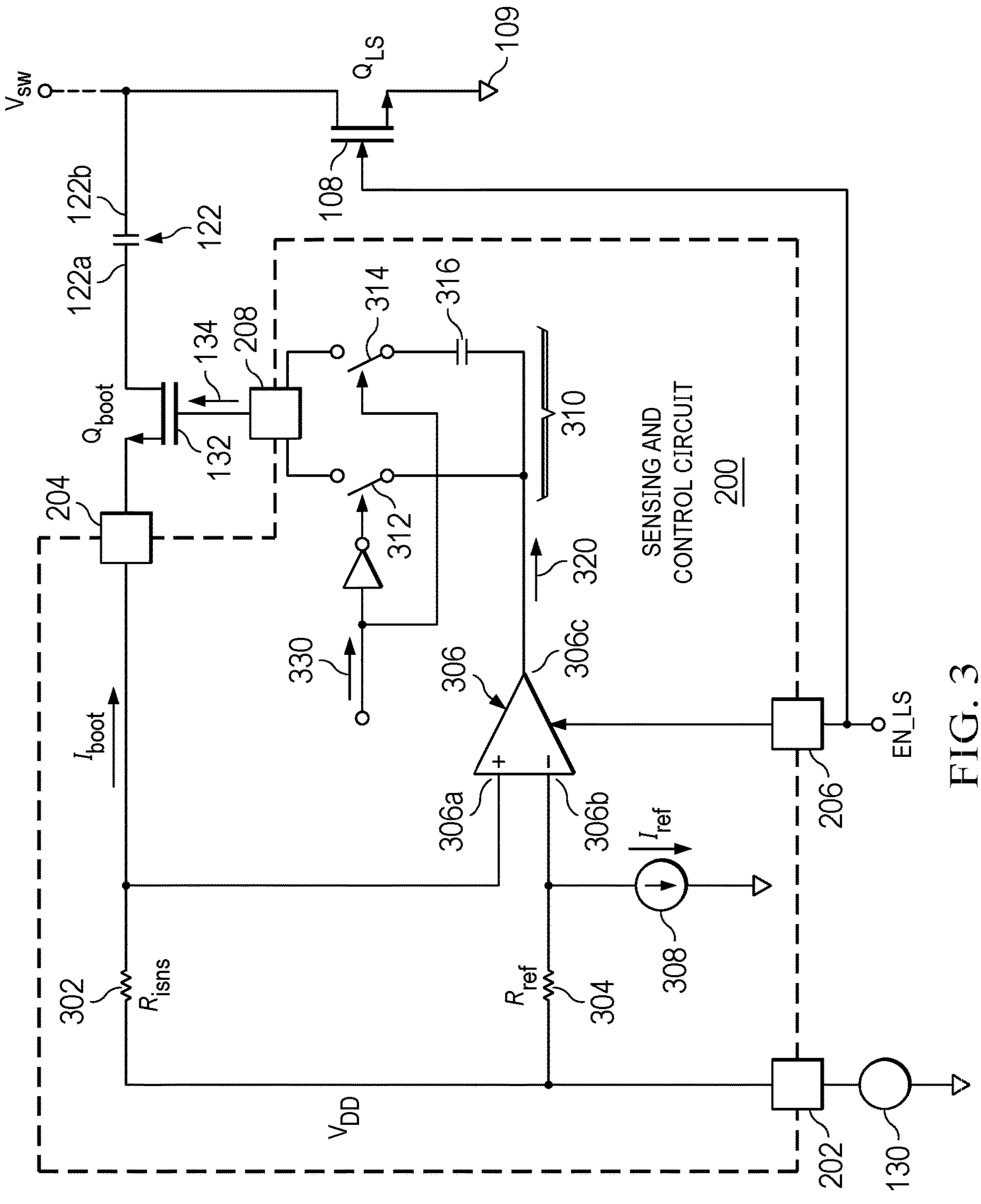
FIG. 3 is a schematic illustrating example internal components of the bootstrap circuit of FIG. 2.

FIG. 3 is a schematic illustrating examples of internal components of sensing and control circuit 200. Referring to FIG. 3, sensing and control circuit 200 includes a resistor 302 (also labelled $R_{isns}$ in FIG. 3), a resistor 304 (also labelled $R_{ref}$ in FIG. 3), an amplifier 306, and a current source 308. Resistor 302 is coupled between power terminal 202 and current terminal 204, which is also coupled to a first input 306*a* (e.g., a positive input) of amplifier 306. Resistor 304 is coupled between power terminal 202 and a second input 306*b* (e.g., a negative input) of amplifier 306. Current source 308 is coupled to second input 306*b* of amplifier 306 and provides a reference current $I_{REF}$ through resistor 304. The output 306*c* of amplifier 306 is coupled to transistor control output 208. In some examples, as shown in FIG. 3, the output of amplifier 306 is coupled to transistor control output 208 via a gate bootstrap circuit 310, which includes a switch 312 coupled between the amplifier output and transistor control output 208, and a switch 314 and a capacitor 316 coupled between the amplifier output and transistor control output 208.

Resistors 302, 304, current source 308, and amplifier 306 forms a feedback loop to regulate the charging current $I_{boot}$ at a target value set by the reference current provided by current source 308. Specifically, a sense current, including charging current $I_{boot}$, flows through resistor 302 and introduces a first voltage drop across resistor 302 from the $V_{DD}$ voltage, which leads to a first voltage at the first input of amplifier 306. Also, the reference current $I_{REF}$ flows through resistor 304 and introduces a second voltage drop across resistor 304 from the $V_{DD}$ voltage, which leads to a second voltage at the second input of amplifier 306. The difference between the first and second voltages can represent a difference between $I_{boot}$ and $I_{REF}$. Amplifier 306 can generate a voltage signal 320 representing the difference, and provide voltage signal 320 to set a gate voltage of transistor 132. Amplifier 306 can adjust voltage signal 320, which sets the on-resistance as well as the voltage drop across of transistor 132, to reduce/minimize the voltage difference between the first and second inputs of amplifier 306, and $I_{boot}$ can be controlled to be at or close to $I_{REF}$.

Also, gate bootstrap circuit 310 can forward voltage signal 320 as control signal 134 via switch 312, or provide control signal 134 as a bootstrapped version of voltage signal 320 via switch 314 and capacitor 316. Capacitor 316 can be pre-charged to store a voltage offset (e.g., 5V), and can provide control signal 134 by adding the voltage offset to voltage signal 320. Gate bootstrap circuit 310 can selectively enable one of switches 312 or 314 based on a bootstrap enable signal 330, which can be generated by another circuit (not shown in FIG. 3) based on comparing voltage signal 320 (at output 306*c* of amplifier 306) with a reference voltage VREF. As described above, the reference voltage can be below $V_{DD}$, while bootstrapped control signal 134 can exceed $V_{DD}$ and track $I_{boot}$ as the charging continues and the voltage of first terminal 122*a* continues increasing. Accordingly, as the voltage of first terminal 122*a* approaches the $V_{DD}$ voltage, transistor 132 can continue to conduct $I_{boot}$ and charge capacitor 122, and sensing and control circuit 200 can continue regulating $I_{boot}$.

Figure 4:
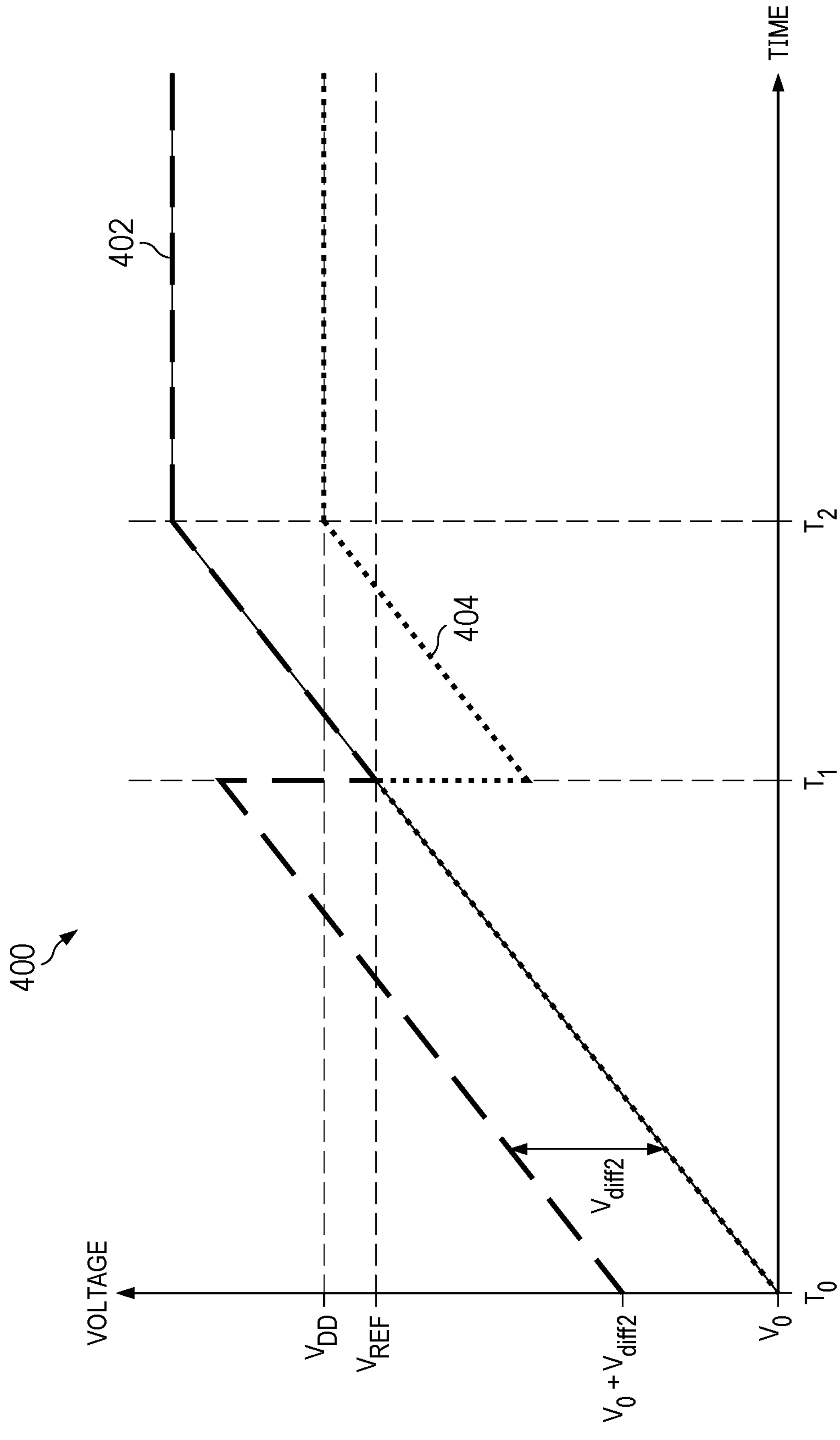
FIG. 4 is a graph illustrating example operations of the bootstrap circuit of FIGS. 2 and 3.

FIG. 4 includes graphs illustrating example operations of sensing and control circuit 200 during the charging phase. FIG. 4 includes graphs 402 and 404. Graph 402 illustrates an example variation of the voltage signal 320 provided by amplifier 306 with time. Graph 404 illustrates an example variation of the bootstrap voltage provided by capacitor 316 with time. In FIG. 4, capacitor 316 is pre-charged to store a voltage difference $V_{diff2}$. FIG. 4 also illustrates $V_{DD}$ and VREF.

Starting at time $T_0$, voltage signal 320 can be at voltage $V_0$, and the bootstrap voltage is at $V_0+V_{diff2}$. Between times $T_0$ and $T_1$, gate bootstrap circuit 310 can provide voltage signal 320 as control signal 134 via switch 312 because voltage signal 320 is below VREF. Also, as capacitor 122 is charged and the voltage at first terminal 122*a* increases, amplifier 306 increases voltage signal 320 (and the gate voltage of transistor 132) correspondingly. Increasing the gate voltage can reduce the on-resistance and the voltage drop across transistor 132 and maintain the voltage at first input (the positive input) of amplifier 306 and maintain $I_{boot}$ at close to $I_{REF}$.

At time $T_1$, voltage signal 320 exceeds VREF. Gate bootstrap circuit 310 can disable switch 312 and enable switch 314, and provide control signal 134 as bootstrapped version of voltage signal 320 by adding $V_{diff2}$. The increase in the gate voltage can lead to a temporary increase in $I_{boot}$, which causes amplifier 306 to reduce voltage signal 320 by $V_{diff2}$, and control signal 134 drops back to VREF.

Between times $T_1$ and $T_2$, as the charging of capacitor 122 continues and the voltage at first terminal 122*a* increases towards $V_{DD}$, amplifier 306 continues increasing voltage signal 320, and control signal 134 also increases with voltage signal 320. Because control signal 134 is bootstrapped from voltage signal 320 by $V_{diff2}$, control signal 134 can exceed $V_{DD}$, so that transistor 132 can continue conducting as its source (and first terminal 122*a*) approaches $V_{DD}$. At time $T_2$, the voltage at first terminal 122*a*, as well as voltage signal 320, reaches $V_{DD}$, and the charging stops.

Figure 5:
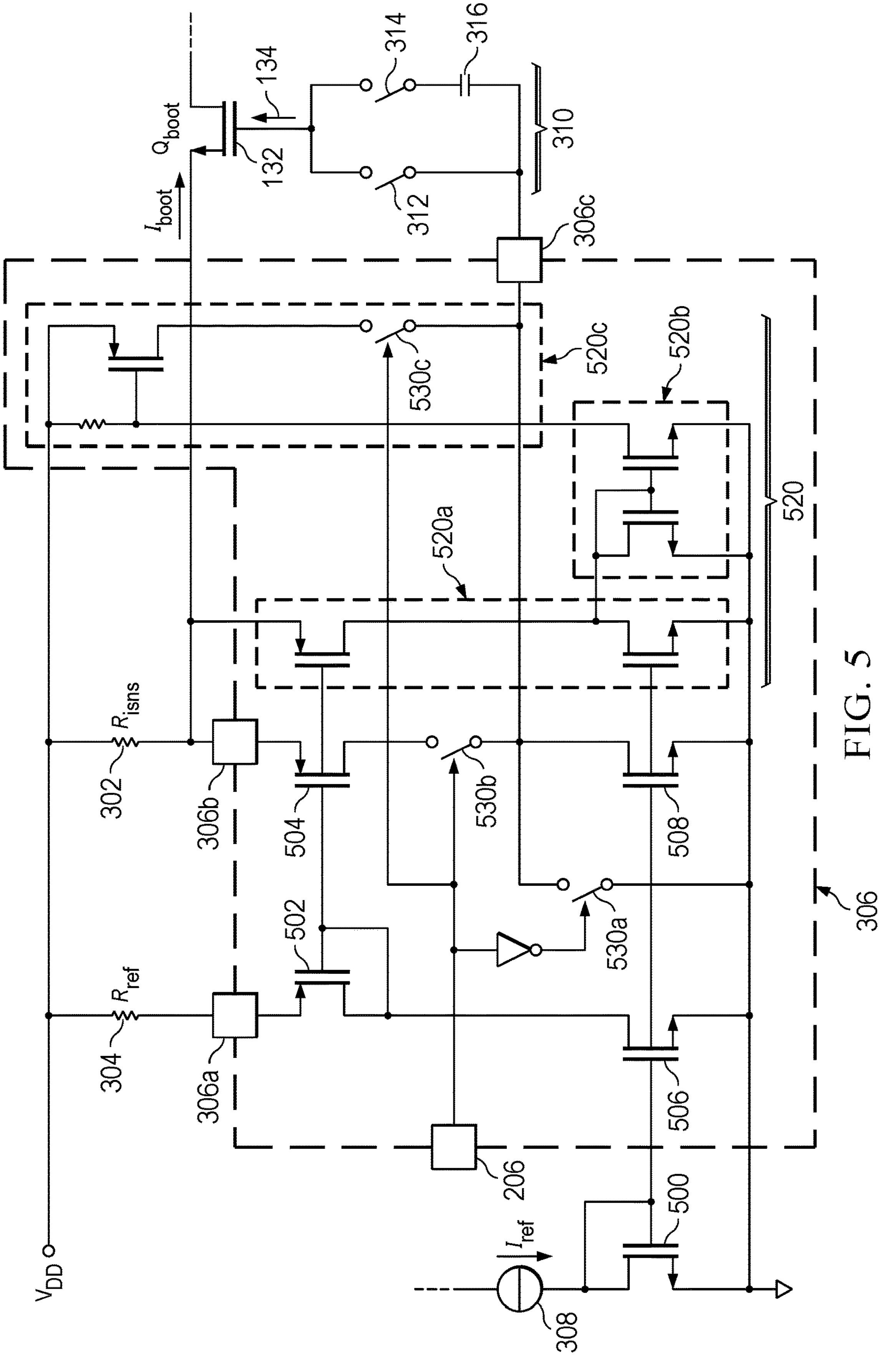
FIGS. 5, 6, 7, and 8 are schematics illustrating example internal components of the bootstrap circuit of FIG. 2.

FIG. 5 is a schematic illustrating example internal components of amplifier 306.

Referring to FIG. 5, amplifier 306 can include a diode-connected transistor 502 and a bias transistor 506 coupled between first input 306*a* and the ground terminal, and a transistor 504 and a bias transistor 508 coupled between second input 306*b* and the ground terminal. Bias transistor 508 is also coupled between output 306*c* and the ground terminal. Each of bias transistors 506 and 508 are biased by a diode-connected transistor 510 to conduct a current that is a replica (and scaled) version of $I_{REF}$ provided by current source 308. Transistors 506 and 508 are sized equally, thus sinking the same current. The currents sunk by transistors 506 and 508 can be small (e.g., 50 uA) and can be negligible compared to the bootstrap current $I_{boot}$ (e.g., 100-200 mA). Further, a ratio between the current sunk by transistor 506, $I_{506}$, and the bootstrap current $I_{boot}$ can be defined by a ratio of resistances of resistor 302 and 304, which is $R_{isns}/R_{ref}$. The current sunk by transistor 506 $I_{506}$ can represent the reference current $I_{ref}$, which can define the target $I_{boot}$ current.

The voltages at inputs 306*a* ($V_{306a}$) and 306*b* ($V_{306b}$) can be represented as follows:

$$V_{306a} = V_{DD} - R_{ref} \times I_{506} \quad \text{(Equation 1)}$$

$$V_{306b} = V_{DD} - R_{isns} \times I_{boot} \quad \text{(Equation 2)}$$

The gates of transistors 502 and 504 are coupled together. If $I_{boot}$ is smaller than the target value, $V_{306b}$ can become higher than $V_{306a}$. This increases the VSG voltage for transistor 504, which is a PFET, and increases the current through transistor 504. The current through 504 can exceed the current sunk by transistor 508, which causes the voltage at output 306*c* to increase. Accordingly, the gate voltage of transistor 132 ($Q_{boot}$) increases, and $I_{boot}$ increases as well.

On the other hand, if $I_{boot}$ is larger than the target value, $V_{306b}$ becomes lower than $V_{306a}$. This reduces the VSG voltage for transistor 504 and reduces the current through transistor 504. The current through 504 can be less than the current sunk by transistor 508, which causes the voltage at output 306*c* to decrease. Accordingly, the gate voltage of transistor 132 ($Q_{boot}$) decreases, and $I_{boot}$ decreases as well.

In some examples, amplifier 306 also includes a slew rate boosting stage 520. Slew rate boosting stage 520 can increase the rate at which amplifier 306 increases the voltage at output 306*c*. Slew rate boosting stage 520 includes a replica stage 520*a* that includes a replica of transistor 504 and bias transistor 508, a current mirror 520*b*, and a pull up stage 520*c*. Replica stage 520*a* can provide a current that represents a mismatch between $I_{REF}$ and $I_{boot}$, which is then mirrored by current mirror 520*b* into pull up stage 520*c*, and pull up stage 520*c* can provide additional current to increase the voltage at output 306*c* at a higher slew rate. In some examples, the slew boosting circuit is configured to provide the increased current only if $I_{boot}$ is far away from its target (e.g. $I_{boot}$<30% target, $I_{boot}*R_{isns}<0.3*R_{ref}*I_{506}$, etc.), to avoid overshoot of the output 306*c* as well as $I_{boot}$.

In addition, amplifier 306 includes switches 530*a*, 530*b*, and 530*c*, each having a switch control terminal coupled to enable input 206. Responsive to enable input 206 indicating that low side switch 108 is enabled (and charging is enabled), switches 530*b* and 530*c* can be enabled, and switch 530*a* can be disabled, which allows amplifier 306 to generate voltage signal 320 to enable transistor 132 and to regulate $I_{boot}$. Also, responsive to enable input 206 indicating that low side switch 108 is disabled (and charging is disabled), switches 530*b* and 530*c* can be disabled, and switch 530*a* can be enabled, which pulls the output of amplifier 306 to the ground voltage to disable transistor 132 and disconnect capacitor 122 from auxiliary power source 130.

Figure 6:
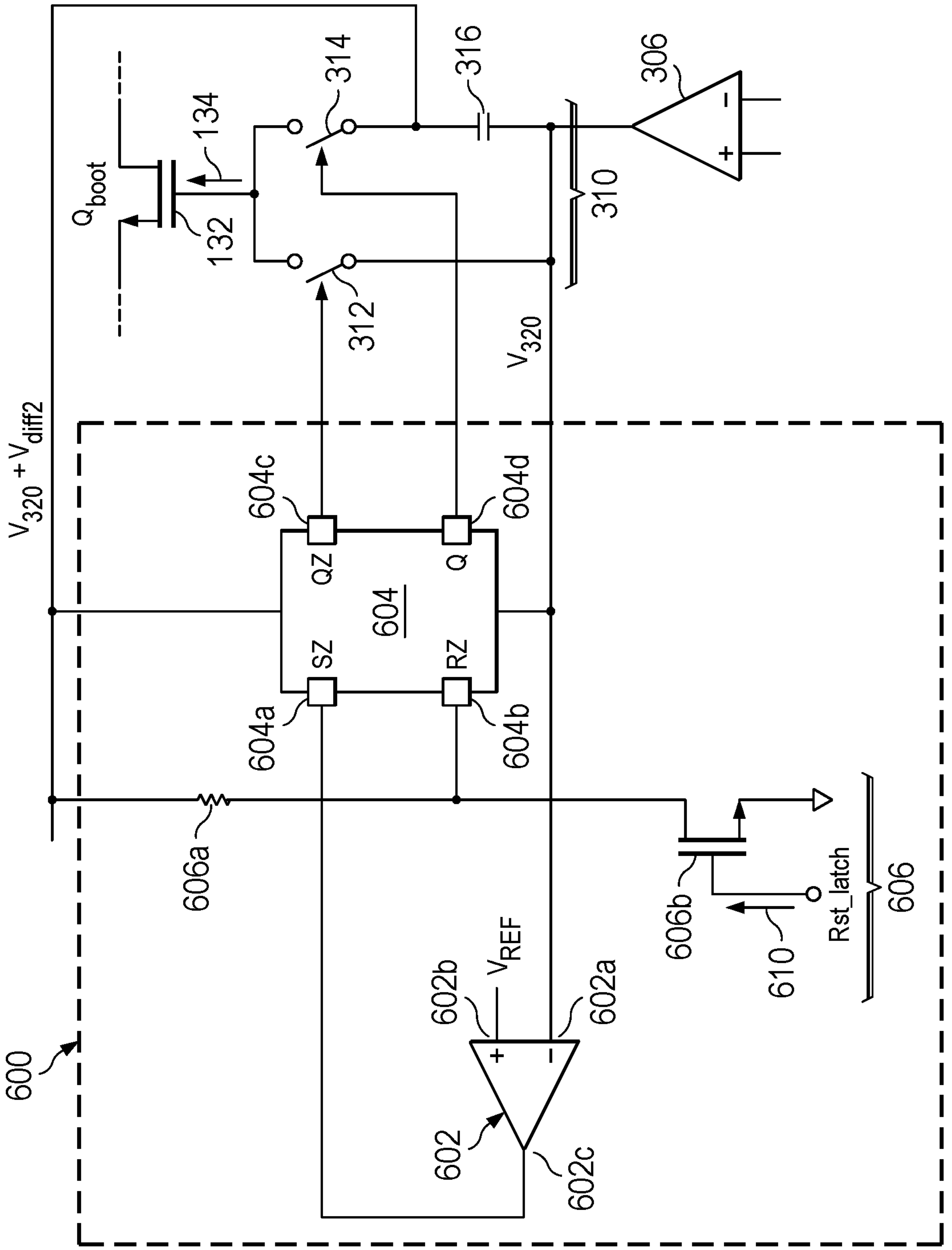

FIG. 6 is a schematic illustrating examples of circuits that control gate bootstrap circuit 310. Referring to FIG. 6, gate bootstrap circuit 310 can be controlled by a control circuit 600 including a comparator 602 and a reset-set latch (RS latch) 604 having a set input 604*a* (also labeled sz), a reset input 604*b* (also labeled rz), a negative output 604*c* (also labelled qz) and a positive output 604*d* (labelled q). In the example of FIG. 6, the set and reset inputs can be active low. Comparator 602 has a first input 602*a* (e.g., a negative input) coupled to output 306*c* of amplifier 306, and a second input 602*b* (e.g., a negative input) that receives the reference voltage VREF. The output of comparator 602 is coupled to the set input of RS latch 604. Also, the reset input of RS latch 604 is coupled to a reset signal generation circuit 606 including a resistor 606*a* and a transistor 606*b* coupled to reset input 604*b*. Comparator 602 and RS latch 604 can operate within a voltage domain defined by voltage signal 320 (labelled $V_{320}$ in FIG. 6) and bootstrapped version of voltage signal 320 (labelled $V_{320}+V_{diff2}$) provided by capacitor 316.

RS latch 604 can be reset by reset signal generation circuit 606 responsive to a reset signal 610 (also labelled Rst_latch in FIG. 6) which enables transistor 606*b* and pulls reset input 604*b* to the ground voltage. With RS latch 604 in the reset state, RS latch 604 can provide a voltage signal at $V_{320}+V_{diff2}$ at negative output 604*c* to enable switch 312, and provide a low voltage signal (e.g., ground voltage, $V_{320}$, etc.) at positive output 604*d* to disable switch 314. Accordingly, bootstrap circuit 310 can provide voltage signal 320 ($V_{320}$) as control signal 134. Also, responsive to voltage signal 320 being below VREF, comparator 602 can set the voltage at set input 604*a* to $V_{320}$, and RS latch 604 can enter the set state. With RS latch 604 in the set state, RS latch 604 can provide a voltage signal at $V_{320}$ at negative output 604*c* to disable switch 312, and provide a voltage signal at $V_{320}+V_{diff2}$ at positive output 604*d* to enable switch 314. Accordingly, bootstrap circuit 310 can provide the bootstrapped voltage signal 320 ($V_{320}+V_{diff2}$) as control signal 134.

Figure 7:
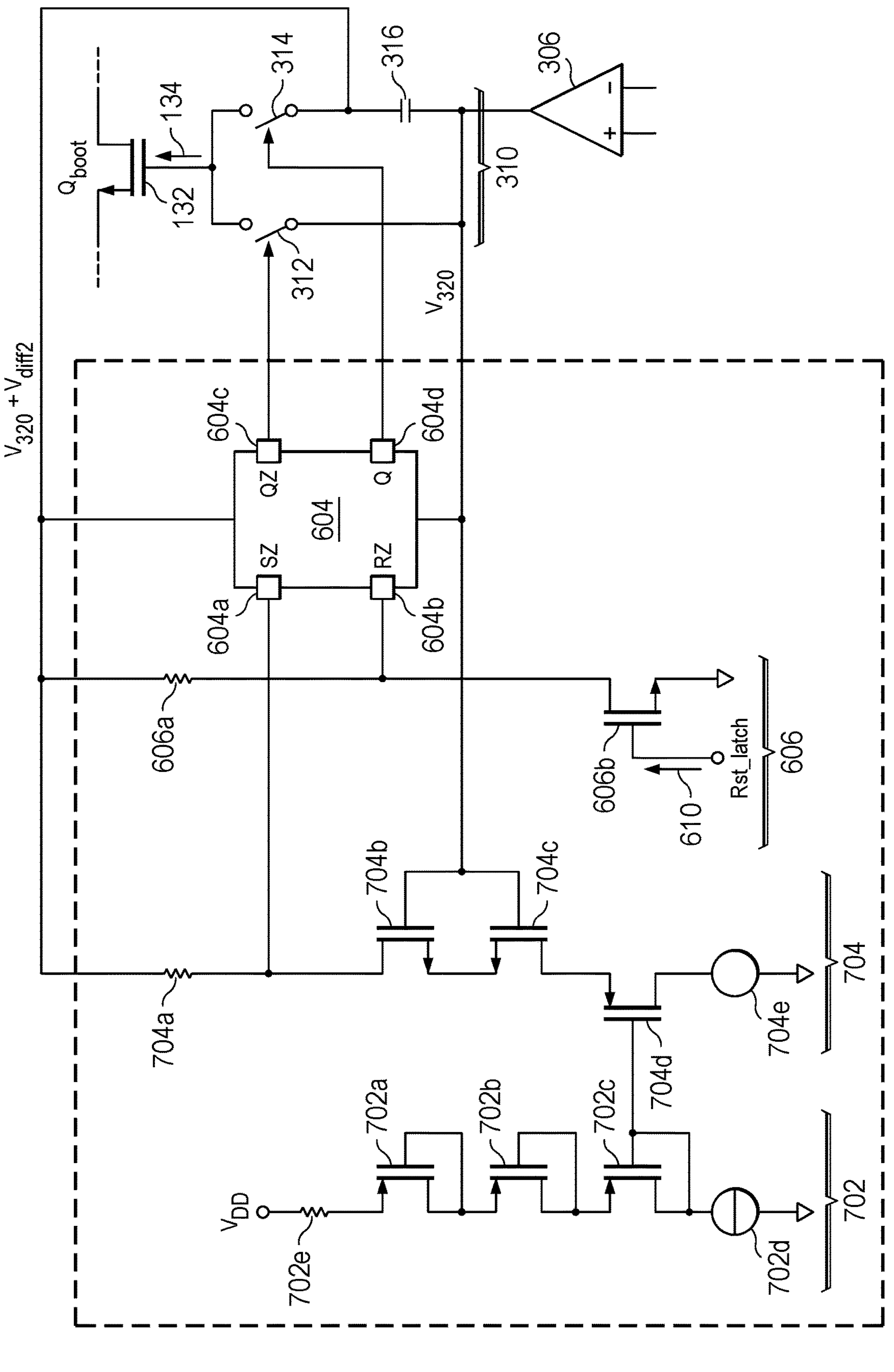

FIG. 7 is a schematic illustrating another example of control circuit 600. In the example shown in FIG. 7, control circuit 600 can pull down set input 604*a* to $V_{320}$ and cause RS latch 604 to enter the set state if the gate voltage of transistor 132 exceeds VREF, where VREF is defined by threshold voltages of transistors of control circuit 600. Specifically, in the example shown in FIG. 7, control circuit 600 includes a branch 702 three diode-connected PFETs 702*a*, 702*b*, and 702*c* coupled between a voltage source that provides the $V_{DD}$ voltage (e.g., auxiliary power source 130) and a current source 702*d*. The diode-connected transistor 702*c* provides a bias voltage of $V_{DD}-3Vtp$, where Vtp is the threshold voltage of each PFET. Some examples may also include a resistor 704*e* coupled between the $V_{DD}$ voltage and diode-connected PFET 702*a* to tune the bias voltage.

Control circuit 600 also includes a branch 704, which includes a resistor 704*a*, NFETs 704*b* and 704*c*, and a PFET 704*d*, coupled between the top plate of capacitor 316 (which has the voltage $V_{320}+V_{diff2}$) and a voltage source 706 that provides a low voltage, such as a ground voltage, or a voltage lower than $V_{DD}$. The gate of PFET 704*d* is coupled to the diode-connected PFET 702*c*. NFETs 704*b* and 704*c* are coupled in series, and their gates are coupled to output of amplifier 306 to receive voltage signal 320 having the voltage $V_{320}$. Each NFET has a threshold voltage Vtn. Resistor 704*a* is coupled between the top plate of capacitor 316 and set input 604*a* of RS latch 604 to provide a pull-up path for set input 604*a*, while NFETs 704*b* and 704*c* and PFET 704*d* are coupled between set input 604*a* and voltage source 706 to provide a pull-down path for set input 604*a*.

The pull-down path for set input 604*a* is enabled, which pulls down set input 604*a* and causes the RS latch 604 to enter the set state, if current flows in branch 704. Current can flow in PFET 704*d* if the source voltage of PFET 704*d* is at least one Vtp higher than the gate voltage of PFET 704*d*, which is $V_{DD}-3Vtp$, hence the source voltage of PFET 704*d* is $V_{DD}-2Vtp$. NFETs 704*b* and 704*c* can conduct the current if the gate voltage of NFET 704*c* ($V_{320}$) exceeds the source voltage of NFET 704*c* by Vtn. Accordingly, current can flow in NFET 704*c*, and RS latch 604 can enter the set state, if $V_{320}$ exceeds $V_{DD}-2Vtp+Vtn$, which can define VREF.

Figure 8:
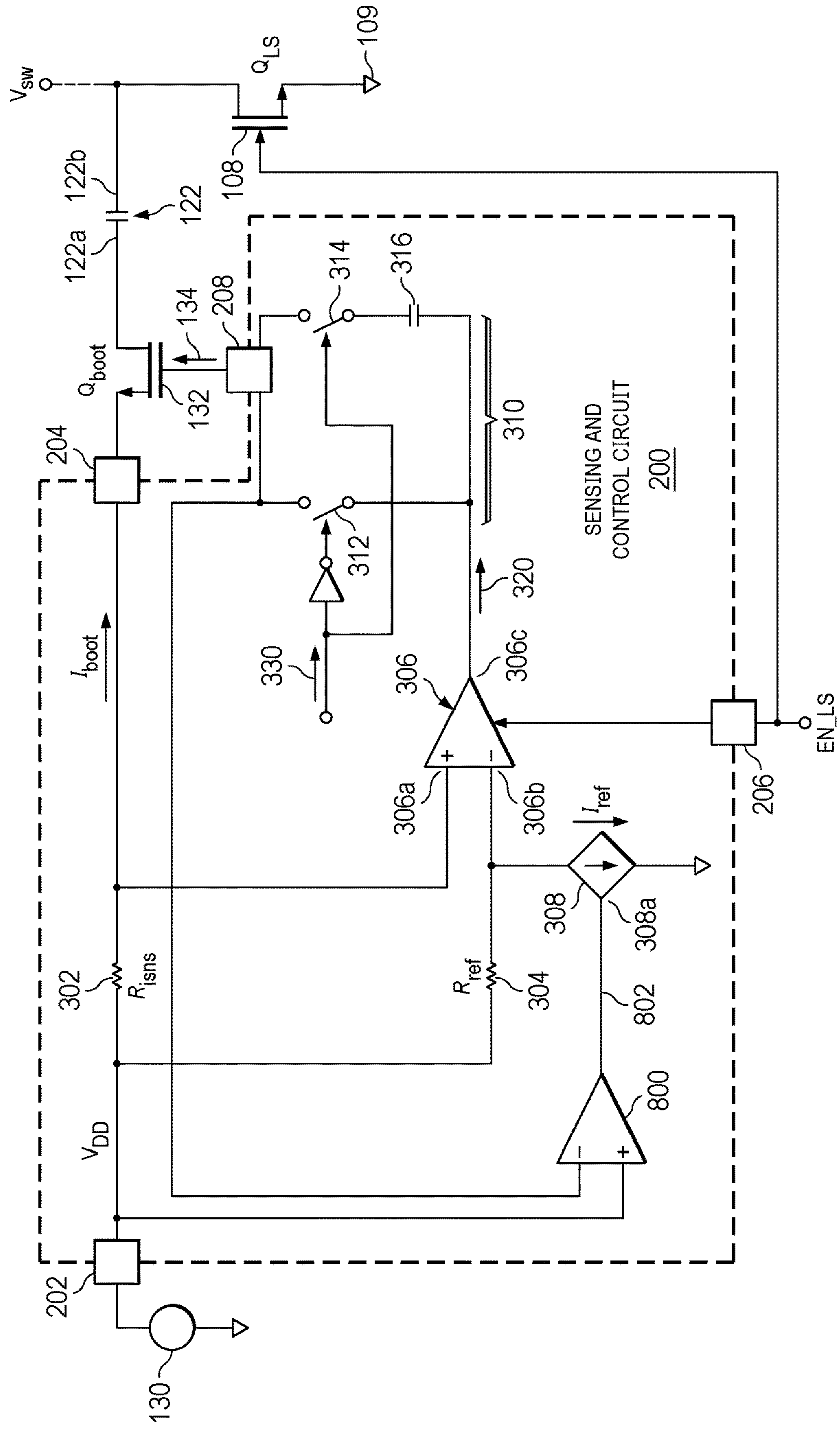

FIG. 8 is a schematic illustrating another example of sensing and control circuit 200. In FIG. 8, current source 308 can be a controllable current source having a control input 308*a* to set the amount of reference current $I_{REF}$. Sensing and control circuit 200 also includes a comparator 800 having a first input (e.g., a positive input) coupled to auxiliary power source 130 to receive the $V_{DD}$ voltage, a second input (e.g., a negative input) coupled to the gate of transistor 132 to receive control signal 134 representing the gate voltage, and an output coupled to control input 308*a* of current source 308. Comparator 800 can compare between the gate voltage of transistor 132 and generate a control signal 802. Responsive to the gate voltage being below the $V_{DD}$ voltage, which indicate that the charging is at an initial stage and the voltage difference across transistor 132 is relatively large, comparator 800 can set control signal 802 in a first state (e.g., an asserted state), which causes current source 308 to output a reduced $I_{REF}$, and sensing and control circuit 200 can regulate $I_{boot}$ at the reduced $I_{REF}$. Responsive to the gate voltage being above the $V_{DD}$ voltage, which indicate that the charging is at a later stage and the voltage difference across transistor 132 is relatively small, comparator 800 can set control signal 802 in a second state (e.g., an asserted state), which causes current source 308 to output an increased $I_{REF}$, and sensing and control circuit 200 can regulate $I_{boot}$ at the increased $I_{REF}$ to speed up the charging. With such arrangements, a relatively constant power level can be maintained at transistor 132 to improve safety, while charging speed can be improved as well.

Figure 9:
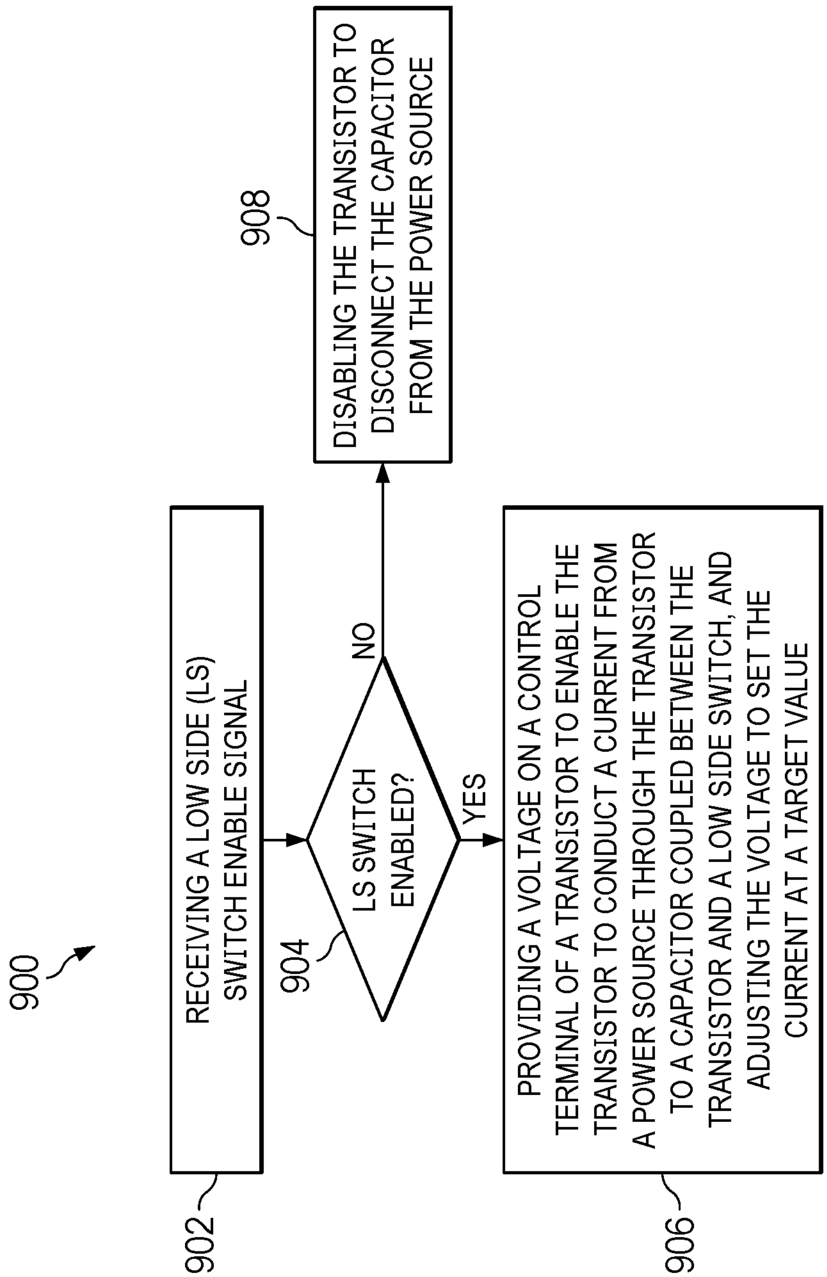
FIG. 9 is a flowchart illustrating an example method of charging a bootstrap capacitor.

FIG. 9 illustrates a flowchart of an example method 900 of charging a bootstrap capacitor. Method 900 can be performed by, for example, sensing and control circuit 200 of FIGS. 2-8 and transistor 132.

In operation 902, sensing and control circuit 200 receives a low side (LS) switch enable signal, such as enable signal 210.

In operation 904, sensing and control circuit 200 determines whether LS switch (e.g., LS switch 108) is enabled based on the state of the enable signal.

In operation 906, responsive to the state of the enable signal indicating that LS switch is enabled, which indicates the charging phase begins, sensing and control circuit 200 provides a voltage on a control terminal of a transistor (e.g., gate voltage of transistor 132) to enable the transistor to conduct a current (e.g., $I_{boot}$) from a power source (e.g., auxiliary power source 130) through the transistor to a capacitor coupled between the transistor and a low side switch (e.g., capacitor 122), and adjusting the voltage to set the current at a target value. As described above, sensing and control circuit 200 can enable transistor 132 to provide the current to charge capacitor 122. Also, as the voltage across capacitor 122 increases due to charging, sensing and control circuit 200 can adjust the voltage to reduce the on-resistance and voltage drop across transistor 132, so as to maintain the charging current $I_{boot}$ at a target value (e.g., $I_{REF}$). In some examples, sensing and control circuit 200 can also bootstrap the gate voltage by adding an offset if the gate voltage exceeds a threshold (e.g., VREF) to ensure that the transistor remains enabled as the capacitor voltage approaches the voltage of the power source ($V_{DD}$)). Further, in some examples, sensing and control circuit 200 can regulate the charging current $I_{boot}$ at different target values based on comparing the gate voltage with $V_{DD}$. Sensing and control circuit 200 can regulate $I_{boot}$ at a reduced target value during the initial phase of charging when the gate voltage is below $V_{DD}$, and regulate $I_{boot}$ at an increased target value during the later phase of charging when the gate voltage is above $V_{DD}$.

In operation 908, responsive to the state of the enable signal indicating that LS switch is disabled, which indicates that the charging phase ends, sensing and control circuit 200 can disable the transistor to disconnect the capacitor from the power source. In some examples, sensing and control circuit 200 can set the gate voltage to a ground voltage to disable transistor 132.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

While the use of particular transistors is described herein, other transistors (or equivalent devices) may be used instead. For example, a p-channel field effect transistor (PFET) may be used in place of an n-channel field effect transistor (NFET) with little or no changes to the circuit. Furthermore, other types of transistors may be used, such as laterally-diffused metal-oxide semiconductor (LDMOS) FETs) and bipolar junction transistors (BJTs). Furthermore, the devices may be implemented in/over a silicon substrate (Si), a silicon carbide substrate (SiC), a gallium nitride substrate (GaN) or a gallium arsenide substrate (GaAs).

References herein to a field effect transistor (FET) being "ON" means that the conduction channel of the FET is present and drain current may flow through the FET. References herein to a FET being "OFF" means that the conduction channel is not present and drain current does not flow through the FET. A FET that is OFF, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments and examples, and other embodiments and examples are possible, within the scope of the claims, such as the examples herein below.

What is claimed is:

1. An apparatus comprising:

a first transistor having a first control terminal and first and second current terminals;

a capacitor coupled between a switching terminal and the first current terminal;

a second transistor having a second control terminal and coupled between the switching terminal and a ground terminal; and a circuit having a power terminal, a third current terminal, an enable input, and a transistor control output, the third current terminal coupled to the second current terminal, the enable input coupled to the second control terminal, and the transistor control output coupled to the first control terminal, the circuit configurable to set a state of the transistor control output responsive to at least one of: a current between the power terminal and the third current terminal and through the first transistor, or a voltage at the first control terminal.

2. The apparatus of claim 1, wherein the circuit is configurable to:

generate a control signal responsive to a difference between the current and a reference current;

responsive to the enable input having a first state, provide the control signal having a first state at the transistor control output, in which the first transistor is enabled responsive to the control signal having the first state; and responsive to the enable input having a second state, provide the control signal having a second state at the transistor control output, in which the first transistor is disabled responsive to the control signal having the second state.

3. The apparatus of claim 2, wherein the control signal having the first state has a same voltage as the ground terminal.

4. The apparatus of claim 2, wherein the circuit is configurable to, responsive to the voltage at the first control terminal exceeding a threshold, provide a bootstrapped version of the control signal at the transistor control output by adding a voltage offset.

5. The apparatus of claim 2, wherein the circuit includes:

an amplifier having a first input, a second input, the enable input, and an amplifier output, the first input coupled to the third current terminal, and the amplifier output coupled to the transistor control output;

a first resistor coupled between the power terminal and the third current terminal;

a second resistor coupled between the power terminal and the second input; and a current source coupled to the second input and configurable to provide the reference current.

6. The apparatus of claim 5, wherein the capacitor is a first capacitor, and the circuit further includes:

a first switch coupled between the amplifier output and the transistor control output, the first switch having a first switch control terminal;

a second switch and a second capacitor coupled between the amplifier output and the transistor control output, the second switch having a second switch control terminal; and a switch control circuit having a control input, a first switch control output, and a second switch control output, the control input coupled to the transistor control output, the first switch control output coupled to the first switch control terminal, and the second switch control output coupled to the second switch control terminal.

7. The apparatus of claim 6, wherein the switch control circuit is configurable to:

responsive to the voltage at the transistor control output being below a threshold, enable the first switch and disable the second switch; and responsive to the voltage being at or above the threshold, enable the second switch and disable the first switch.

8. The apparatus of claim 5, wherein the current source has a current control input; and wherein the circuit is configurable to set a state of the current control input based on the voltage at the first control terminal of the first transistor.

9. The apparatus of claim 8, wherein the circuit includes a comparator having a first input, filed, and a comparator output, the first input coupled to the first control terminal, the second input coupled to the power terminal, and the comparator output coupled to the current control input, the comparator configurable to:

set the current control input to a first state responsive to a first voltage at the first control terminal being below a second voltage at the power terminal; and set the current control input to a second state responsive to the first voltage being above the second voltage; and wherein the current source is configurable to:

responsive to the current control input having the first state, provide a first current through the second resistor; and responsive to the current control input having the second state, provide a second current through the second resistor, in which the second current exceeds the first current.

10. The apparatus of claim 1, wherein the second transistor is a low side switch of a half bridge circuit.

11. The apparatus of claim 10, wherein the half bridge circuit is part of a power converter or a motor inverter.

12. The apparatus of claim 1, wherein each of the first and second transistors includes a high electron mobility transistor (HEMT).

13. The apparatus of claim 12, wherein each of the first and second transistors includes an enhance mode (E-mode) HEMT.

14. A system comprising:

a first transistor coupled between a power input and a switching terminal, the first transistor having a first transistor control input;

a second transistor coupled between the switching terminal and a ground terminal, the second transistor having a second transistor control input;

a first driver having a first driver output, a first power supply terminal, and a first reference terminal, the first driver output coupled to the first transistor control input, and the first reference terminal coupled to the switching terminal;

a capacitor coupled between the first power supply terminal and the first reference terminal;

a second driver having a second driver output, a second power supply terminal, and a second reference terminal, the second driver output coupled to the second transistor control input, and the second reference terminal coupled to the ground terminal;

a circuit having a power terminal, a current terminal, an enable input and a transistor control output, the power terminal coupled to the second power supply terminal, and the enable input coupled to the second transistor control input, the circuit configurable to set a state of the transistor control output responsive to at least one of: a current between the power terminal and the current terminal, or a voltage at the transistor control output; and a third transistor coupled between the current terminal and the first power supply terminal, the third transistor having a third transistor control input coupled to the transistor control output.

15. The system of claim 14, wherein the circuit is configured to:

generate a control signal responsive to a difference between the current and a reference current;

responsive to the enable input having a first state, provide the control signal having a first state at the transistor control output, in which the third transistor is enabled responsive to the control signal having the first state; and responsive to the enable input having a second state, provide the control signal having a second state at the transistor control output, in which the third transistor is disabled responsive to the control signal having the second state.

16. The system of claim 15, wherein the circuit is configurable to, responsive to the voltage at the third transistor control input exceeding a threshold, provide a bootstrapped version of the control signal the transistor control output by adding a voltage offset.

17. The system of claim 14, wherein the circuit is configurable to:

responsive to the voltage at the third transistor control input being below a threshold, provide a first current at the current terminal; and responsive to the voltage at the third transistor control input being above the threshold, provide a second current larger than the first current at the current terminal.

18. The system of claim 14, wherein each of the first, second, and third transistors includes a respective E-mode HEMT.

19. A method comprising:

receiving a low side (LS) switch enable signal that controls a low side switch;

responsive to the LS switch enable signal having a first state, setting a voltage on a control terminal of a transistor based on sensing a current from a power source through the transistor to a capacitor coupled between the transistor and the low side switch; and responsive to the LS switch enable signal having a second state, disabling the transistor to disconnect the capacitor from the power source.

20. The method of claim 19, wherein setting the voltage on the control terminal includes: responsive to the voltage exceeding a threshold, provide a bootstrapped version of the voltage by adding a voltage offset to the control terminal.

* * * * *